United States Patent [19]
Slavin et al.

[11] Patent Number: 4,755,811
[45] Date of Patent: Jul. 5, 1988

[54] TOUCH CONTROLLED ZOOM OF WAVEFORM DISPLAYS

[75] Inventors: Keith R. Slavin, Aloha; Donald Craig, Portland, both of Oreg.

[73] Assignee: Tektronix, Inc., Beaverton, Oreg.

[21] Appl. No.: 30,758

[22] Filed: Mar. 24, 1987

[51] Int. Cl.⁴ .......................... G09G 1/16; G06F 3/14
[52] U.S. Cl. ................................ 340/731; 340/709; 340/721; 324/121 R
[58] Field of Search ............. 340/709, 731, 722, 721, 340/734; 324/121 R

[56] References Cited

U.S. PATENT DOCUMENTS

| | | | |
|---|---|---|---|
| 4,197,590 | 4/1980 | Sukonick et al. | 340/726 |
| 4,532,605 | 7/1985 | Waller | 340/731 |
| 4,546,349 | 10/1985 | Prohofsky et al. | 340/731 |

FOREIGN PATENT DOCUMENTS 59-107269 6/1984 Japan .................. 324/121 R

Primary Examiner—Howard A. Birmiel
Attorney, Agent, or Firm—Francis I. Gray

[57] ABSTRACT

Touch controlled zoom of a waveform display uses a touch screen for the display surface. Function buttons for moving or expanding the waveform display and for determining the axis of such movement or expansion operate in conjunction with a rotary encoder. Expansion, or zoom, is accomplished by contacting the screen overlying a point on the waveform about which zoom is desired. Such contact or activation of the expand function button results in movement of the rotary encoder providing a gain parameter to a zoom function. The zoom function operates on the waveform display in an exponential manner as a function of the gain parameter to expand or contract the waveform display about the zoom point according to the direction of rotation of the rotary encoder.

6 Claims, 5 Drawing Sheets

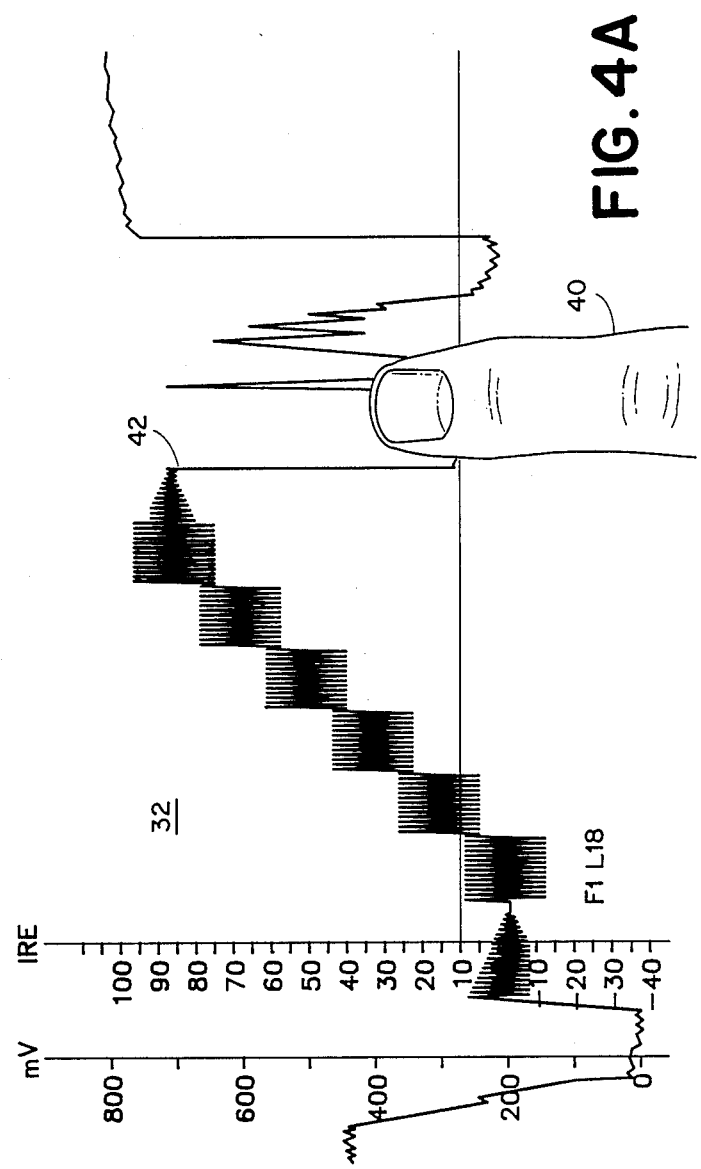

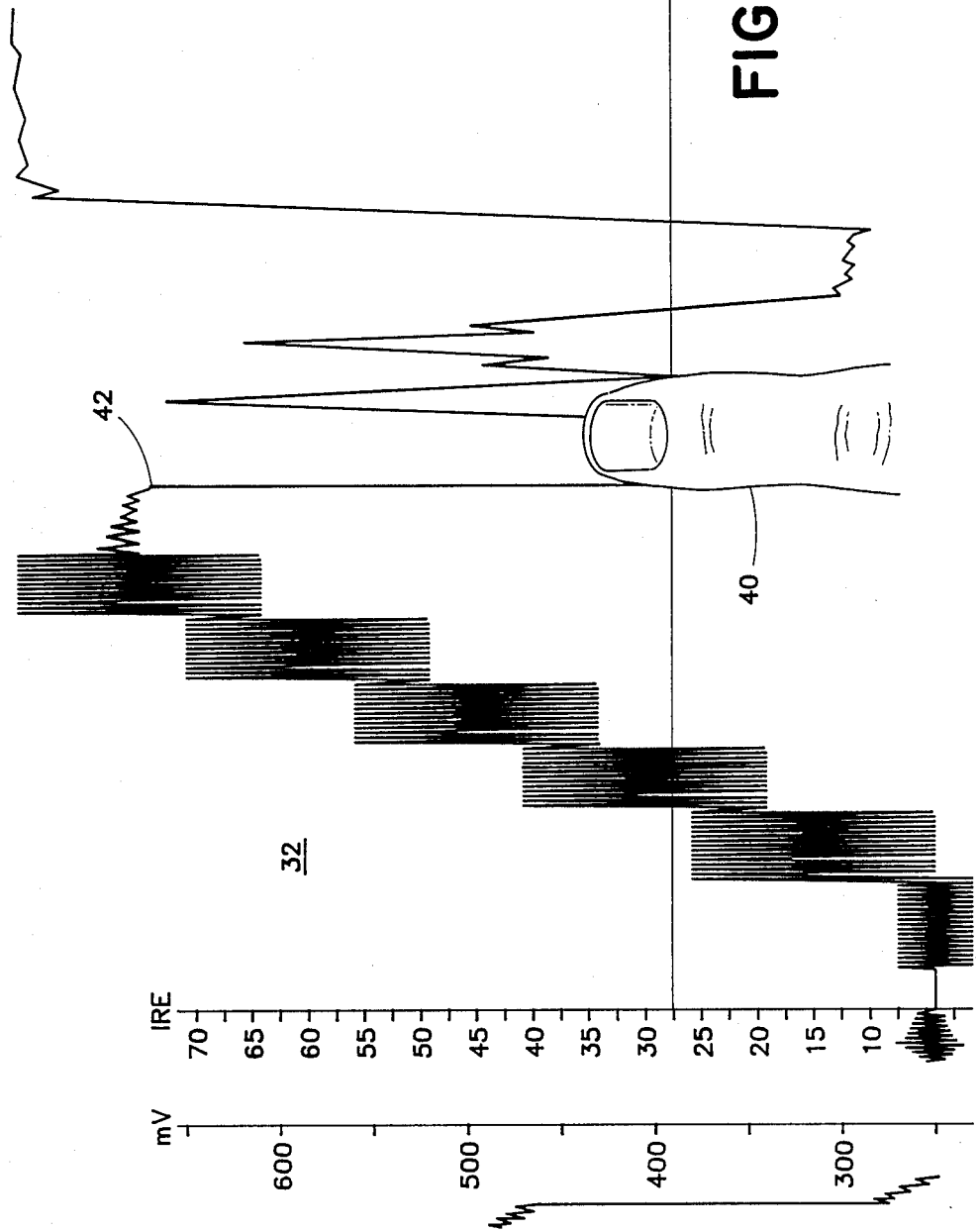

TOUCH CONTROLLED ZOOM OF WAVEFORM DISPLAYS

BACKGROUND OF THE INVENTION

The present invention relates to waveform display instruments, and more particularly to a method for controlling zoom of a waveform display using a touch screen as an interaction control.

In conventional waveform monitoring equipment, such as oscilloscopes and television waveform monitors, a waveform display is controlled by a gain and a position control in each of the x and y axes. This requires four knobs, and the interaction between the gains and offsets is usually awkward. Changing the gain generally requires changing the offset, or position, to keep a certain point of the waveform on the display.

What is desired is a method for controlling the gain of a waveform about a given point on the waveform without the necessity of adjusting the offset to keep the given point on the display screen.

SUMMARY OF THE INVENTION

Accordingly the present invention provides a method for controlling zoom of a waveform display about a given point without the need for readjusting the offset. Either a point on the waveform which underlies a predetermined point on the display screen, or a point on the waveform indicated by contact of the display screen by an operator are selected as the point about which a zoom function is to be performed. Once the zoom point is identified, the waveform is expanded, or contracted, exponentially via rotation of a rotary encoder with the given point remaining stationary within the display area.

The objects, advantages and novel features of the present invention will be apparent from the following detailed description when read in conjunction with the appended claims and attached drawing.

BRIEF DESCRIPTION OF THE DRAWING

FIGS. 4A and 4B illustrate the zoom of a waveform along the vertical axis using a touch control according to the present invention.

DESCRIPTION OF THE PREFERRED EMBODIMENT

Figure 1:
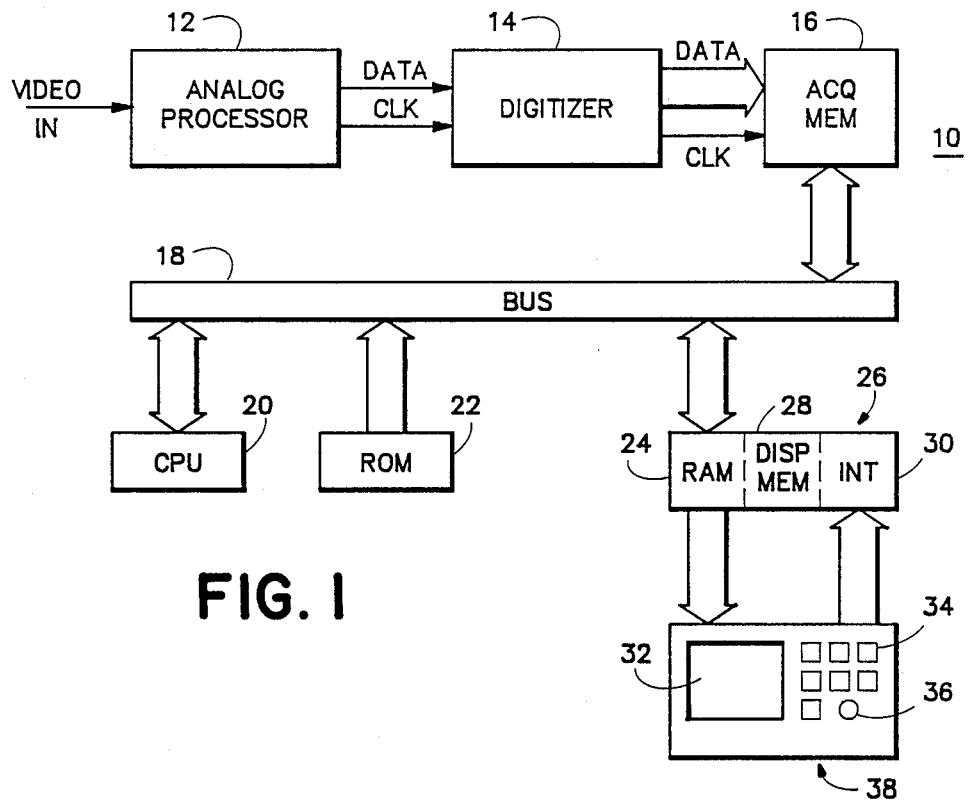
FIG. 1 is a block diagram of an instrument incorporating the touch controlled zoom of the present invention.
Figure 2:
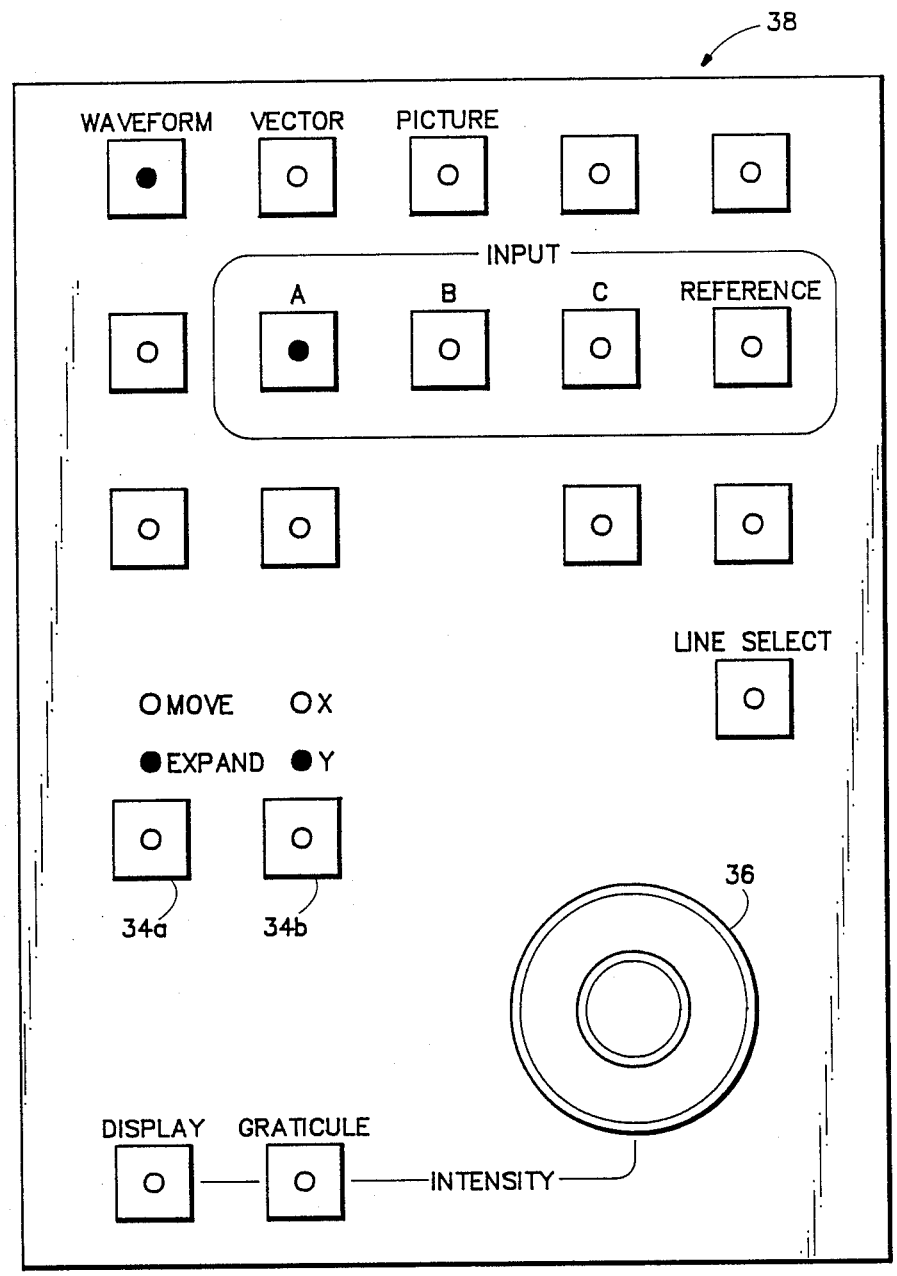
FIG. 2 is a plan view of a front panel for the instrument of FIG. 1.
Figure 3A:
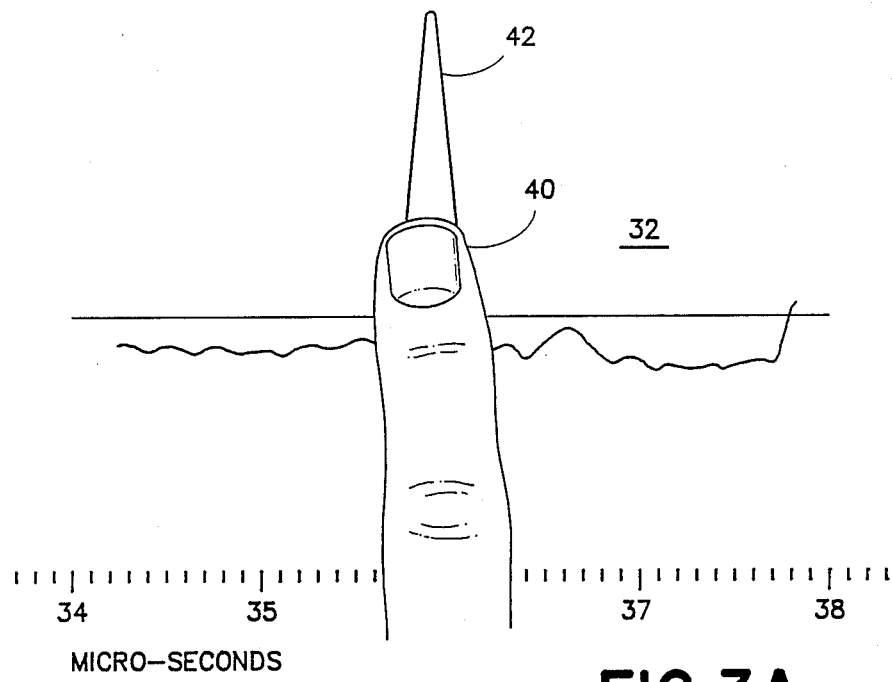
FIGS. 3A and 3B illustrate the zoom of a waveform along the horizontal axis using a touch control according to the present invention.
Figure 3B:
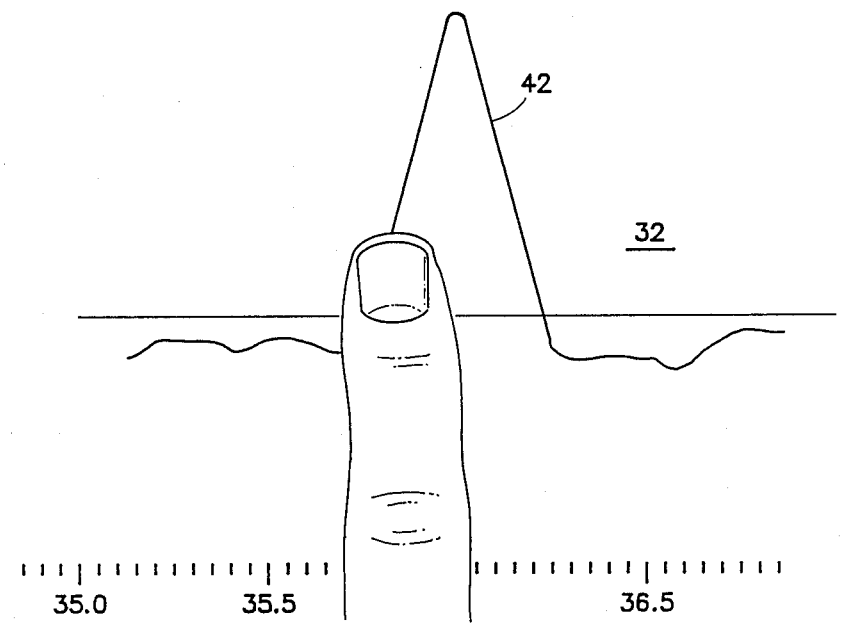

Referring now to FIGS. 1 and 2 an instrument 10 is shown having an input video signal, such as a television video signal. The video signal is conventionally processed in the analog domain by an analog processor 12, digitized by a digitizer 14, and stored in an acquisition memory 16. The acquisition memory 16 is connected to a communications bus 18 to which also are connected a central processing unit (CPU) 20 with associated ROM 22 and RAM 24, and a display interface unit 26. The display interface unit 26 includes the RAM 24, a display memory 28 and an interface circuit 30. The contents of the display memory 28 are displayed on a screen 32. The digitized video data from the acquisition memory 16 is processed by the CPU 20 according to the functions and parameters input by an operator via function buttons 34 and a rotary encoder knob 36 on a front panel 38, and via interaction with the screen 32. The processed data is stored in the display memory 28 together with appropriate scales, cursors and display information. Movement and zoom of a waveform on the screen 32 are controlled by a MOVE/EXPAND function button 34a, an X/Y select button 34b, the rotary encoder 36 and contact with the screen 32.

To move, position or offset a waveform display the MOVE/EXPAND function button 34a is in the move position and the X/Y select button 34b selects the axis along which such movement is desired. In this mode the rotation of the rotary encoder 36 operates in a conventional manner to move the waveform along the selected axis. Movement along the amplitude, or y, axis is limited so that the waveform is not lost off the screen. To zoom the waveform display there are two basic methods available—one which requires only one hand of an operator and the other with requires both hands of the operator.

For one-handed operation the MOVE/EXPAND function button 34a is toggled to the expand mode. Now rotation of the rotary encoder 36 results in zoom of the waveform and does not affect the movement, positioning or offset of the waveform. The zoom point, or point on the waveform about which the zoom function occurs, may be determined in one of two ways. The zoom point may be a default position related to the screen 32 such that the point on the waveform under the default position becomes the zoom point. Alternatively, the zoom point may be determined by contacting the screen 32 at the point on the waveform about which zoom is desired. The contact point, or pixel position, on the screen 32 is converted by the CPU 20 into the underlying point on the waveform which becomes the zoom point. The zoom point remains unchanged until the operator contacts the screen 32 again.

For two-handed operation the MOVE/EXPAND function button 34a is left in the move mode. Now contact of the screen 32 by an operator's finger 40, for example as shown in FIGS. 3A, 3B, 4A and 4B, operates to establish both the zoom point and the entry into the zoom mode. So long as the finger 40 remains in contact with the screen 32, the CPU 20 reacts as if the MOVE/EXPAND function button 34a is in the expand mode and the waveform 42 is zoomed in response to rotation of the rotary encoder 36, either to expand or contract the waveform according to the direction of rotation of the rotary encoder. When the finger 40 breaks contact with the screen 32, rotation of the rotary encoder 36 moves the waveform 42 in the conventional manner.

The zoom is performed in an exponential manner so that for each complete rotation of the rotary encoder 36 the waveform gain is changed by the same magnitude, i.e., one revolution of the rotary encoder results in a magnitude change of two, for example. This results in a smooth apparent change in gain of the waveform. In this manner multiple cycles of the waveform may be observed simultaneously, or only a very small portion of one cycle, or horizontal line for a television video signal, may be observed in detail. As shown in FIGS. 3A, 3B, 4A and 4B the zoom function may be performed along both axes depending upon the axis selected by the X/Y select button 34b.

Thus the present invention provides a touch controlled zoom of a waveform display which allows an operator to interact with the waveform on a screen so that the point of interest remains on the screen during zoom without requiring offset adjustments of the waveform.

What is claimed is:

1. An apparatus for controlling zoom of a displayed waveform comprising:

means for indicating a point on the displayed waveform about which zoom is desired; and means for zooming the displayed waveform about the indicated point so that the indicated point remains stationary.

2. An apparatus as recited in claim 1 wherein the indicating means comprises:

a display surface overlying the displayed waveform; and means for converting a default position with respect to the display surface into a waveform point on the displayed waveform underlying the default position, the waveform point being the indicated point.

3. An apparatus as recited in claim 2 wherein the indicating means further comprises means for determining the default position by contacting the display surface at a surface point overlying the point about which zoom is desired.

4. An apparatus as recited in claim 1 wherein the zooming means comprises:

means for entering a zoom function; and a rotary encoder, rotation of which results in changing a gain parameter which is used by the zoom function for zooming the displayed waveform about the indicated point.

5. An apparatus as recited in claim 4 wherein the entering means comprises:

a display surface overlying the displayed waveform; and means for interpreting contact of the display surface as a command for entering the zoom function.

6. An apparatus as recited in claim 1 further comprising means for determining an axis along which zoom is desired.

* * * * *